United States Patent
Maxim et al.

(10) Patent No.: US 7,095,287 B2
(45) Date of Patent: Aug. 22, 2006

(54) METHOD AND APPARATUS TO ACHIEVE A PROCESS, TEMPERATURE AND DIVIDER MODULUS INDEPENDENT PLL LOOP BANDWIDTH AND DAMPING FACTOR USING OPEN-LOOP CALIBRATION TECHNIQUES

(75) Inventors: Adrian Maxim, Austin, TX (US); James Kao, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 31 days.

(21) Appl. No.: 11/023,981

(22) Filed: Dec. 28, 2004

(65) Prior Publication Data

US 2006/0139105 A1 Jun. 29, 2006

(51) Int. Cl.
*H03L 7/06* (2006.01)
*H03L 7/08* (2006.01)

(52) U.S. Cl. .................. 331/44; 331/11; 331/14; 331/16; 331/25

(58) Field of Classification Search .............. 331/1 A, 331/8, 10, 11, 14, 16, 18, 25, DIG. 2; 327/156–159; 332/128; 360/51; 375/376; 455/260
See application file for complete search history.

(56) References Cited

U.S. PATENT DOCUMENTS

2003/0203720 A1* 10/2003 Oosawa et al. ............... 455/84

OTHER PUBLICATIONS

Boerstler, "A Low-Jitter PLL Clock Generator For Microprocessors With Lock Range Of 340-612 MHz", IEEE Journal Of Solid-State Circuits, vol. 34, No. 4, Apr. 1999, pp. 513-519.

Maneatis et al., "Self-Biased, High-Bandwidth, Low-Jitter 1-to-4096 Multiplier Clock-Generator PLL", ISSCC, Session 24, Paper 24.2, 2003, 10 pgs.

Maneatis et al., "Self-Biased, High-Bandwidth, Low-Jitter 1-to-4096 Multiplier Clock-Generator PLL", IEEE Journal Of Solid-State Circuits, vol. 38, No. 11, Nov. 2003, pps. 1795-1803.

(Continued)

*Primary Examiner*—David Mis
(74) *Attorney, Agent, or Firm*—O'Keefe, Egan & Peterman, LLP

(57) ABSTRACT

Several open-loop calibration techniques for phase-locked-loop circuits (PLL) that provide a process, temperature and divider modulus independence for the loop bandwidth and damping factor are disclosed. Two categories of open-loop techniques are presented. The first method uses only a single measurement of the output frequency from the oscillator and adjusts a single PLL loop element that performs a simultaneous calibration of both the loop bandwidth and damping factor. The output frequency is measured for a given value of the oscillator control signal and the charge-pump current is adjusted such that it cancels the process variation of the oscillator gain. The second method uses two separate and orthogonal calibration steps, both of them based on the measurement of the output frequency from the oscillator when a known excitation is applied to the open loop signal path. In the first step the loop bandwidth is calibrated by adjusting the charge-pump current based on the measurement of the forward path gain when applying a constant phase shift between the two clocks that go to the phase frequency detector, while the integral path is hold to a constant value. During the second step the damping factor is calibrated by adjusting the value of the integral loop filter capacitor based on the measurement of the oscillator output frequency when excited with a voltage proportional with the integral capacitor value, while the proportional control component is zeroed-out.

24 Claims, 8 Drawing Sheets

OTHER PUBLICATIONS

Maxim, "A 10GHz SiGe OC192 Frequency Synthesizer Using A Passive Feed-Forward Loop Filter And A Half Rate Oscillator", IEEE, 2004, pp. 363-366.

Maxim, "A Low Voltage, 10-2550MHz, O.15μ CMOS, Process And Divider Modulus Independent PLL Using Zero-VT MOSFETs", IEEE, 2003, pp. 105-108.

Payne et al, "A 150-MHz Translinear Phase-Locked Loop", IEEE Transactions On Circuits And Systems-II: Analog And Digital Signal Processing, vol. 45, No. 9, Sep. 1998, pp. 1220-1231.

Maxim et al., "A Low-Jitter 125-1250-MHz Process-Independent And Ripple-Poleless 0.18μm CMOS PLL Based On A Sample-Reset Loop Filter", IEEE Journal Of Solid-State Circuits, vol. 36, No. 11, Nov. 2001, pp. 1673-1683.

* cited by examiner

METHOD AND APPARATUS TO ACHIEVE A PROCESS, TEMPERATURE AND DIVIDER MODULUS INDEPENDENT PLL LOOP BANDWIDTH AND DAMPING FACTOR USING OPEN-LOOP CALIBRATION TECHNIQUES

BACKGROUND OF THE INVENTION

The present invention relates to the field of phase locked loop (PLL) circuits, and more particularly to PLLs utilized in frequency synthesizers for wideband tuner applications, such as for example, satellite, cable, or terrestrial TV tuner applications.

There exist a large variety of PLL architectures. One way of classifying them is based on the type of controlled oscillator type. There are voltage controlled oscillator based PLLs and current controlled oscillator based PLLs. Another way of classifying the PLLs is based on the type of loop filter. There are passive RC or active loop filters and voltage-mode or current-mode loop filters. Also the PLLs can be classified as a function of the method used to generate the stabilizing zero. There are RC time constant based PLLs and feed-forward based PLLs.

FIGS. 1a–1d present some examples of prior art PLL architectures. FIG. 1a shows a passive RC loop filter PLL using a voltage controlled oscillator. FIG. 1b shows a passive RC loop filter PLL using a current controlled oscillator. FIG. 1c presents an example of a feed-forward loop filter using a voltage controlled oscillator while FIG. 1d shows an example of a feed-forward loop filter PLL using a current controlled oscillator.

A typical PLL loop (for example PLLs 100a–d as shown in FIGS. 1a–1d) consists of a reference oscillator that provides an input reference clock 102, the phase frequency detector 104 (PFD) that compares the reference clock with the feedback clock, the charge-pump 106 (CP) that injects a positive or negative current in the loop filter 108 (LF) based on the direction of the phase difference between the two input clocks, the loop filter 108 (that can be passive or active, without or with feed-forward loop) that ensures the loop stability, the controlled oscillator 110 (voltage controlled VCO or current controlled ICO) and the feedback divider 112 (N) that sets the output clock frequency (fout=N*fref).

The time constants and settling behavior of a PLL are dependent on physical elements (resistors, capacitors, currents, etc) that may have a significant variation over process, temperature and supply voltage. Furthermore in variable output frequency synthesizers the natural frequency, loop bandwidth and damping factor are dependent on the feedback divider modulus (usually denoted with N).

The system level specifications typically impose restrictions on the loop bandwidth, jitter peaking and transient overshoot and settling time. Another critical parameter for the output clock jitter performance is the loop damping factor, that is intrinsically related to the feedback loop phase margin and describes the stability of the entire feedback system.

During the integrated circuit fabrication all of these PLL parameters will vary in a certain range and they may impact the performance of the circuit if they exceed some limit ranges. Many applications require a constant loop bandwidth and damping factor over the entire output frequency range, which means over the entire range of the feedback divider modulus (N). Thus, a divider modulus independent loop bandwidth and damping factor PLL architecture is required.

For example, in the case of a charge-pump PLL using a standard passive RC loop filter and a voltage controlled oscillator (VCO), the natural frequency ($\omega n$), ripple filtering pole ($\omega p$), damping factor ($\xi$), loop bandwidth ($\omega c$), ripple pole frequency ($\omega_p$) and pole-zero separation (p/z) are given by the following equations:

$$\omega_n = \sqrt{\frac{Kvco \cdot Icp}{2\pi \cdot N \cdot Ci}} \quad (1)$$

$$\omega_z = \frac{1}{R \cdot Ci} \quad (2)$$

$$\xi = \frac{1}{2} \cdot \frac{\omega n}{\omega z} = \frac{R}{2}\sqrt{\frac{Kvco \cdot Icp \cdot Ci}{2\pi \cdot N}} \quad (3)$$

$$\omega_c = \frac{\omega n^2}{\omega z} = \frac{R \cdot Kvco \cdot Icp}{2\pi \cdot N} \quad (4)$$

$$\omega_p = \frac{1}{R \cdot \frac{Cp \cdot Ci}{Cp + Ci}} \approx \frac{1}{R \cdot Cp} \quad (5)$$

$$p/z = \frac{\omega p}{\omega z} = \frac{Ci}{\frac{Cp \cdot Ci}{Cp + Ci}} \approx \frac{Ci}{Cp} \quad (6)$$

where Kvco is the oscillator gain, Ci is the integration capacitor, Cp is the ripple pole capacitor, R is the stabilizing zero resistance, N is the feedback divider modulus and Icp is the charge-pump current.

In most semiconductor fabrication processes (e.g. CMOS, bipolar or BICMOS processes) the on-chip resistance and capacitance variation over the worst case process corners is around ±20%. Also depending on the way in which the charge-pump current is generated it can have a variation up to ±25%. In the case that the oscillator is a ring oscillator, the oscillator gain is dependent finally also on some type of capacitance (that is charged and discharge every cycle) and the equivalent resistor through which the charging and discharging is performed if a constant voltage is applied or the equivalent constant current that charges and discharges that capacitance. Thus the oscillator gain can have as much as ±40% variation over the worst case corners. In the LC oscillator case, the gain depends on the tank inductance and capacitance value and also on the transconductance of the oscillator amplifier. In this case the gain may have a lower process variation, but still can be as high as ±20%.

During integrated circuit processing the different elements that influence the loop bandwidth and stability may result in corners that produce a cumulative variation of the loop parameters (either on the positive or negative side). Therefore variations as large as 100% can result if no measures to compensate the process variation are taken. For example if a PLL is designed to have a typical damping factor of $\xi=1$ in the nominal process corner, it may vary after process fabrication having a damping factor between 0.5 and 2, resulting in a drastically different peaking and settling time performance. Similarly, process variation may appear on other critical PLL loop specifications such as loop bandwidth, overshoot, peaking, settling time, etc. This uncertainty in the PLL performance leads to a poorly behaved design.

One solution to overcome the performance degradation due to process and temperature variation of the on-chip components is to allow in the design phase enough margins such that even in the worst case corners the critical specifications do not go outside the recommended range for proper operation of the PLL. The main drawback of this solution is that a suboptimal design results because of the large margins that need to be built-in in order to compromise between the contradicting PLL specifications (e.g. good stability requires a higher value of the damping factor and this results in a higher settling time).

Another solution to overcome the PLL performance variations is to try to compensate them by building a process, temperature and even a divider modulus independent PLL architecture.

Several architectures have been proposed to ensure a partial or even a fully independence of the PLL performance on the process temperature and divider modulus corners.

A wide spread solution to achieve a process independent PLL is to use a self biasing technique. It consists in using as charge-pump current a fraction of the current that drives the oscillator. In this way the Kvco*Icp term results virtually process independent. For feed-forward loop filter PLLs the loop bandwidth and the damping factor result dependent on ratios of capacitors that track well over process and thus have a high process independence. In the case of a passive RC filter in which the stabilizing zero is set with an on chip series resistor, this should be calibrated to a fixed value (e.g. using an off-chip high precision resistor) in order to achieve the process independence of the damping factor. The main drawback of the self-biasing technique is that it adds one more feedback loop to the system that may result in start-up or nonlinear stability issues. Thus, extra circuitry needs to be used to avoid these problems, increasing the complexity of the design. Furthermore, generally the self-biasing technique can be applied only to the ring oscillator based PLLs where the oscillator current gives an indication of the oscillator gain. This is not the case for the LC oscillator where the gain is practically independent of the current through the active devices of the amplifier (Kvco has only a very weak dependence on gm of the active device).

An alternative solution to compensate the process variation is to use a bandgap referencing technique. It consists of relating some of the elements that appear in the damping factor and loop bandwidth expressions to the bandgap voltage that has a very low process and temperature variation.

Taking again the example of the passive RC loop filter PLL, if the charge-pump current is made inverse proportional to the square of the on-chip resistor value (Icp=Vbg/Rbg$^2$), where Vbg is the bandgap voltage and Rbg is the bandgap resistance, than the damping factor results proportional to $\sqrt{Vbg \cdot R/Rbg}$. If the loop filter resistance (R) is built with the same unit resistance as the bandgap resistance (Rbg) and uses the same orientation, then they will track each other over process and their ratio (R/Rbg) will have virtually no process and temperature variation.

In the case of ring oscillators, the oscillator gain is inverse proportional to the total capacitance at the output of each ring inverter. This capacitance is usually dominated by the gate capacitance of the devices from the active inverter stage. If the loop filter uses MOS capacitors of the same type with the one used in the oscillator ring inverter, then they will track reasonably well over process and temperature and the Kvco*Ci term will become almost process independent.

A major drawback of this architecture is that while the damping factor results process independent, the loop bandwidth has a strong process variation due to the 1/Rbg term. Furthermore in many PLLs the loop filter capacitor cannot be made of the same device type as the ring oscillator active devices. One example is when the oscillator operates at GHz range and needs to use deep-submicron devices, while the loop filter needs to use thick oxide devices to minimize the gate leakage current that would otherwise degrade the reference spurs performance. Thus the damping factor will have a residual process variation given by $\sqrt{Kvco \cdot Ci}=\sqrt{Ci/Cvco}$ which can have as large as ±25% variation depending on the oscillator and loop filter capacitor types.

A similar bandgap referencing process independent architecture can be applied to the feed-forward PLL case using a voltage controlled oscillator. The natural frequency (ωn), ripple filtering pole (ωp), damping factor (ξ), loop bandwidth (ωc) and pole-zero separation (p/z) are given by the following equations:

$$\omega_n = \sqrt{\frac{Kvco \cdot Icpi \cdot gmi}{2\pi \cdot N \cdot Ci}} = \sqrt{\frac{Kvco \cdot Icpi}{2\pi \cdot N \cdot Ci \cdot Ri}} \quad (7)$$

$$\omega_z = \frac{Icpp}{Icpi} \cdot \frac{gmi}{kip \cdot Ci} = \frac{Icpp}{Icpi} \cdot \frac{1}{Ri \cdot kip \cdot Ci} \quad (8)$$

$$\xi = \frac{1}{2} \cdot \frac{\omega n}{\omega z} = \frac{kip}{2} \cdot \frac{Icpp}{Icpi} \sqrt{\frac{Kvco \cdot Icp \cdot Ci \cdot Ri}{2\pi \cdot N}} \quad (9)$$

$$\omega_c = \frac{\omega n^2}{\omega z} = \frac{Ri \cdot Kvco \cdot Icpp}{2\pi \cdot N} \quad (10)$$

$$\omega_p = \frac{1}{Rp \cdot Cp} \quad (11)$$

$$p/z = \frac{\omega p}{\omega z} = \frac{Icpp}{Icpi} \cdot \frac{Rp \cdot Cp}{Ri \cdot kip \cdot Ci} \quad (12)$$

where Kvco is the oscillator gain, Ci is the integration capacitor, Cp is the ripple pole capacitor, gmi is the integral path transconductance, Ri is the integral path degeneration resistance, Rp is the ripple pole resistance, Kip is the proportional path current gain, N is the feedback divider modulus and Icpi and Icpp are the integral and proportional charge-pump currents.

The kip current gain is given usually by a current mirror that has a very low process dependence, and the ratio of the two charge-pump currents has also a very small process variation. If the charge-pump current is generated from a bandgap voltage using a V-to-I converter (Icp=Vbg/Rbg) than the Icpi*Ri=Vbg*Ri/Rbg has virtually no process variation (assuming that Ri and Rbg are reasonably matched). As the Kvco*Ci term has also a very low process variation, then the damping factor has a low process variation, while the loop bandwidth has only a moderate process variation due to the Kvco oscillator gain.

The main drawback of this solution is that it can be applied only to the current controlled oscillator based PLLs and not to the voltage controlled oscillator based PLLs.

To achieve the feedback divider modulus independence several solutions have been proposed in the past. They involve the variation of one of the elements from the damping factor expression (capacitor, resistor or current) such that it compensates for the N modulus variation.

One solution is to change the charge-pump current (called charge-pump switching architecture), in which Icp is made proportional to N and thus the Icp/N term becomes independent of N. As Icp and N appear in the damping factor and loop bandwidth expressions in the same position (at numerator respectively at the denominator) the charge-pump current switching ensures both the damping factor and loop bandwidth N independence. The drawback of this technique is the increased ripple on the oscillator control signal due to the increased parasitic switching effects that appear at larger charge-pump currents (clock injection and channel charge sharing). This is particularly troublesome in the wide frequency range PLLs that require a large loop bandwidth. In this case, the charge-pump needs to vary over a wide range to compensate the N change and also needs to be rather high to ensure the high bandwidth. The increased ripple on the oscillator control signal leads to elevated reference spurs levels which are of great concern in the frequency translation PLLs.

An alternative solution is to change the loop filter integral capacitance (Ci) directly proportional to the N modulus (named capacitor switching technique). Ci is varied such that the Ci/N term becomes N independent and thus the damping factor results N independent. To achieve an N independent pole-zero separation the ripple pole capacitance (Cp) needs to be switched also proportional to the N feedback divider modulus. The advantage of this architecture is the preservation of the good reference spurs performance over the entire output frequency range (a low charge-pump current value is used). The drawback is the large variation of the loop bandwidth with the N modulus (Ci does not influence the loop bandwidth) and the relatively large loop filter capacitor value, particularly in the wide frequency range applications). The large loop filter area may also be a concern in the case of mixed analog-digital chips where a larger area increases the sensitivity to substrate noise coupling.

The existing process and temperature independent PLL architectures belong to the closed-loop architecture category in which the PLL feedback loop is always kept active. The advantage of this approach is that it does not need additional time for the calibration process. The calibration is done either continuous or a-priori. The self-biasing technique is a continuous time closed loop architecture in which the charge-pump current is permanently changed by the additional feedback loop to compensate the on-chip element variation. The advantage of the continuous time element variation is that it can compensate also for the dynamic temperature variations. The bandgap referencing technique is also a closed loop calibration method using an a-priori tuning in which no measurements (feedback control) are done. The loop elements are tuned based on a bandgap voltage value that resides outside the PLL loop and can be at a large distance from the PLL and thus may operate at drastically different temperature. Therefore the bandgap referencing technique is more sensitive to the temperature variation of the loop elements.

In most applications the process variation of the on-chip element values (±20 . . . ±25%) is much larger than the temperature variation (±1 . . . ±3%) so process variations are the dominant factor.

It is therefore desirable to provide a PLL that overcomes some or all of the problems described above to provide a process, temperature and divider modulus independence for the loop bandwidth and damping factor.

SUMMARY OF THE INVENTION

A new PLL architecture that achieves the process and temperature independence of both the loop damping factor and loop bandwidth by using an open loop calibration technique is disclosed herein. The PLL architecture provides a high accuracy tuning of both loop bandwidth and damping factor to the desired value. In addition, the PLL architecture and techniques can be applied to many existing types of PLL architectures (LC or ring oscillator based, voltage or current controlled oscillator, RC or feed-forward loop filters, etc.). Further the PLL architecture and techniques do not contain an additional feedback loop and thus does not present start-up or nonlinear stability issues. The calibration circuit has a low complexity and does not impact the PLL operation in closed loop.

Two types of PLL architectures are disclosed: a reduced complexity one that involves only one calibration step that achieves a partial compensation of the loop bandwidth and damping factor process variation (suitable for middle to low-end applications) and a high accuracy calibration scheme that involves two separate and orthogonal tuning steps (suitable for high-end applications).

In addition, an oscillator gain switching technique that changes the Kvco term proportional with the N feedback divider modulus such that the Kvco/N term becomes N independent is provided. This makes both the damping factor and the loop bandwidth to be N modulus independent. This technique is well suited for PLLs having a narrow to moderate N modulus range (one or two octaves of variation). Changing the oscillator gain more than a factor of four while ensuring a high resolution increases the complexity of the oscillator capacitors switching circuit and reduces the maximum operating frequency (troublesome particularly in the multi-GHz oscillators). In the case of a wide N modulus range an alternative solution is proposed that uses a combined oscillator gain and charge-pump current switching technique such that Kvco*Icp/N is kept N independent. This ensures an optimal compromise between maximum oscillating frequency and the reference spurs performance.

In one embodiment, method of calibrating a phase locked loop circuit is disclosed. The method may comprise opening the loop of the phase locked loop circuit and applying a known signal at at least one point of the phase locked loop circuit while the phase locked loop circuit is in an open loop condition. The method further comprises measuring a frequency of at least one clock signal that results when the known signal is applied in the open loop condition and performing at least one calibration adjustment based upon a difference between the measured frequency and an expected frequency.

In another embodiment, a phase locked loop circuit is disclosed that comprises a loop path within the phase locked loop circuit and a switchable circuit element connected within the loop path to selectively open the loop path for performing a calibration of the phase locked loop circuit. The circuit may further include at least one known calibration signal coupled to the switchable circuit element, the known calibration signal selectively provided to the phase locked loop circuit for open loop measurements. The circuit further includes a frequency measurement circuit coupled to a clock signal generated by the phase locked loop circuit; and calibration adjustment circuitry coupled to the frequency measurement circuit and at least one portion of the phase locked loop circuit, the calibration adjustment circuitry providing closed loop calibration of the phase locked loop circuit based upon open loop measurements.

DESCRIPTION OF THE PREFERRED EMBODIMENTS

An alternative way to achieve the process independence is disclosed herein by utilizing techniques to open the PLL feedback loop. The open loop approach disclosed herein includes performing some measurements of the output frequency of the oscillator for special cases of driving signals, that give an indication of the loop bandwidth and damping factor value. Based on these measurements correction actions are taken (changing device element values such as resistances, capacitances and/or current values) to compensate for the process variation.

The calibration process may require some additional time to perform the entire tuning sequence, but it may generally be done at chip power-up and thus it does not impact the operation of the synthesizer after the PLL loop is closed. This technique may compensate for the ambient temperature variation at the power-up moment, but it does not necessarily compensate for any subsequent ambient or chip temperature changes.

If the PLL loop can be opened from time to time (e.g. when the circuit is not receiving or transmitting data, or at the moment when the communication channel frequency is changed) an additional calibration can be performed at that time and thus compensate for any additional temperature variation of the PLL loop elements.

As stated before, the temperature variation impact on the PLL loop dynamics is generally much smaller than the process variation and thus often can be neglected without significantly impacting the proper operation of the circuit.

In most applications it is desired to minimize the process variation of both the loop bandwidth and the damping factor. Therefore two separate measurements may be necessary to tune the two parameters independently. Keeping an orthogonal calibration between the loop bandwidth and damping factor generally requires that the tuned element used in the second step does not impact the parameter calibrated during the first step.

An alternative to the two step independent calibration of the loop bandwidth and damping factor is to simultaneously tune the two parameters using a single calibrated element. This reduces significantly the complexity of the calibration circuitry at the price of a more course accuracy. This lower precision method may include a single measurement to be performed and a single element to be tuned that will adjust both the loop bandwidth and the damping factor at the same time.

I. Single Step Open Loop Calibration

Figure 1A:
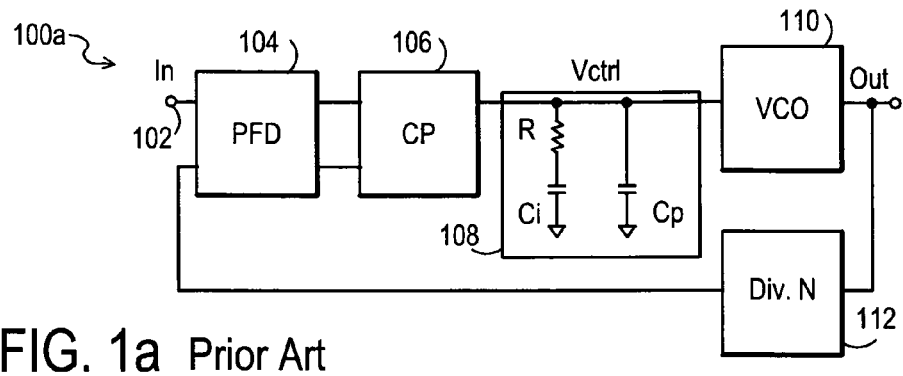
FIGS. 1a–1d illustrate exemplary prior art PLL circuits.
Figure 1B:
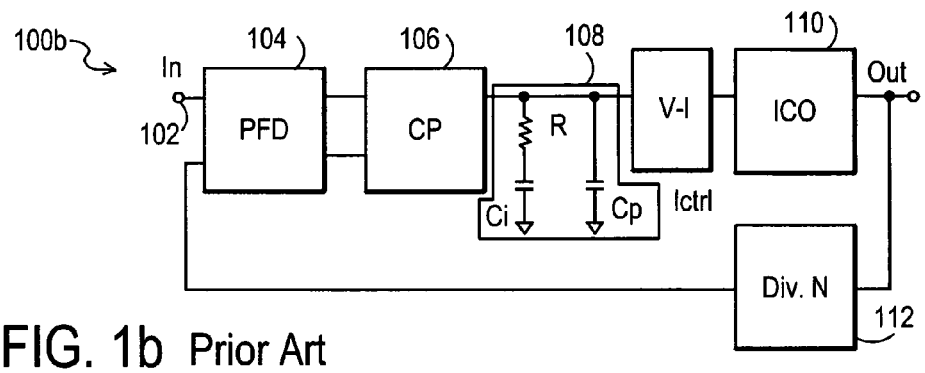
Figure 1C:
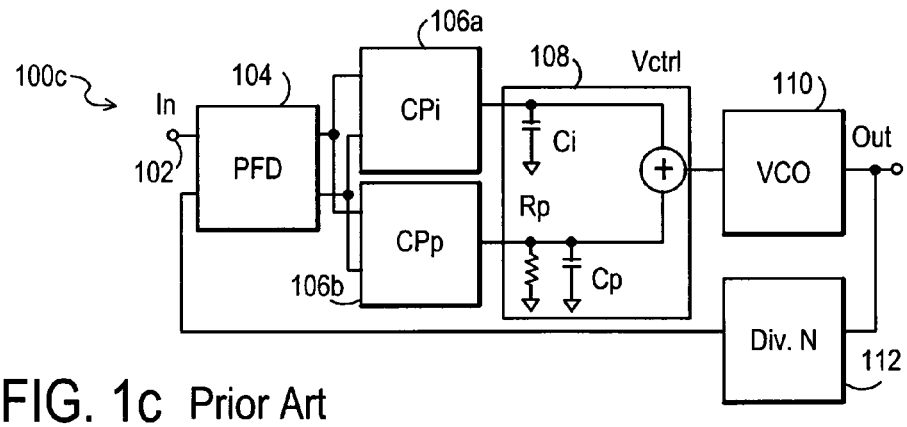
Figure 1D:
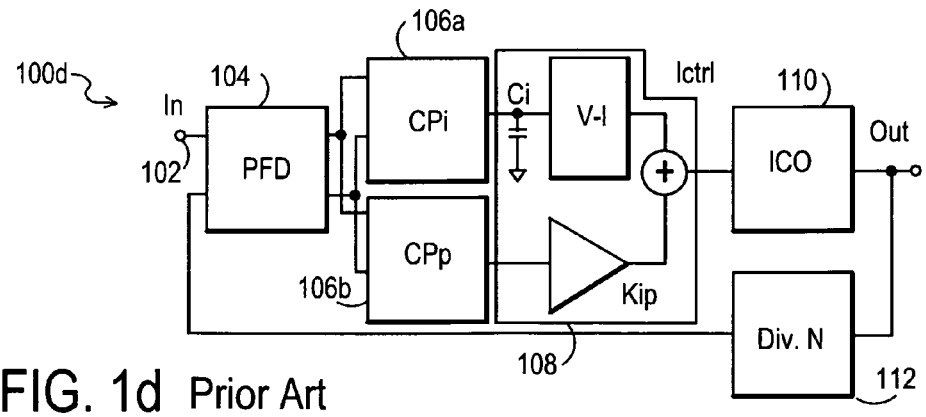
Figure 2:
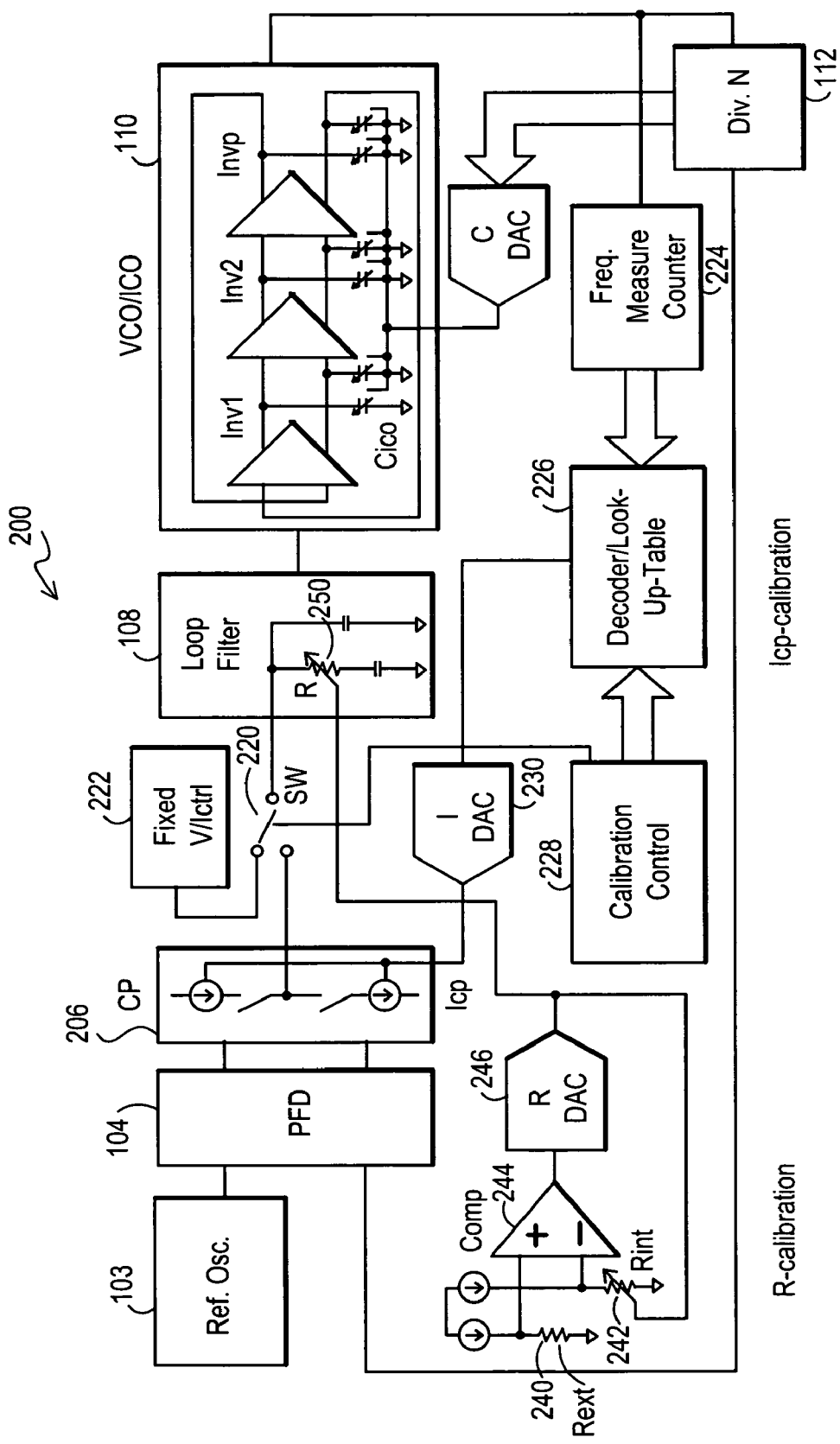
FIG. 2 illustrates a PLL using a single step open loop calibration technique.

FIG. 2 presents a first embodiment of the open-loop PLL calibration technique that uses a reduced complexity calibration circuit and involves only a single step measurement and a single element tuning.

The calibration techniques disclosed herein may comprise the following steps:
   opening the PLL feedback loop (for example, the easiest way to open the loop may be either disabling the phase frequency detector or powering down the charge-pump)
   applying a known stimulus to the opened loop signal path
   measuring the output signal (the output frequency of the oscillator or any divided down version of it)
   taking correction actions based on the measured value
   closing the PLL loop and starting the normal operation of the frequency synthesizer In this manner, a technique is provided that applies a known stimulus to the PLL and allows for corrective adjustments based upon measurements obtained using the known stimulus. As will be described in more detail below, the known stimulus may include providing a known control signal during an open loop condition to the PLL, for example a known input to the loop filter. The advantage of the techniques disclosed herein, though, may be obtained utilizing other approaches for applying a known control signal.

In the case of a passive RC loop filter PLL the loop bandwidth and damping factor expressions are given by:

$$\xi = \frac{1}{2} \cdot \frac{\omega n}{\omega z} = \frac{R}{2} \sqrt{\frac{Kvco \cdot Icp \cdot Ci}{2\pi \cdot N}} \qquad (13)$$

$$\omega_c = \frac{\omega n^2}{\omega z} = \frac{R \cdot Kvco \cdot Icp}{2\pi \cdot N} \qquad (14)$$

A single measurement is performed in this calibration technique and it includes applying a known control signal to the oscillator (Vctrl voltage for VCOs and Ictrl current for ICOs) and then measuring the output frequency. The measured output frequency may then be utilized to adjust one or more elements of the PLL so as to provide a corrective action that will result in a more accurate PLL output.

A PLL 200 utilizing such a technique is shown in FIG. 2. As shown in FIG. 2, a reference oscillator 103, phase frequency detector 104, charge pump 206, loop filter 108, controllable oscillator 110 (which may be a ring oscillator in one embodiment and which may include voltage or current control embodiments), and a divider 112. In addition, a switch 220 may be provided to selectively apply the output of the charge pump 206 to the loop filter 108 or alternatively a fixed control signal source 222 (current or voltage) to the loop filter 108. In the open loop calibration mode, the switch 220 may be set by calibration control circuitry 228 so as to provide an input to the loop filter from the fixed control signal source. Utilizing the fixed control signal, the output frequency of the controllable oscillator may be measured and compared to an expected value based upon knowledge of the fixed control signal. Corrections to the PLL to compensate for deviations from the expected PLL output may then be provided by adjusting the charge pump 206 as discussed in more detail below in order to calibrate the PLL.

One solution for measuring the output frequency is to use a counter 224 (up-count or down-count) that is enabled for a known time interval (for example by gating the counter with a signal generated from the high stability reference clock). The frequency accuracy of the crystal reference oscillators may be of the order of few tens to few hundreds parts per million (ppm). Other frequency measurement techniques can be also utilized without restricting the scope of this invention.

The measurement result (the number stored in the frequency counter 224 at the end of the counting time interval) is directly dependent on the output frequency. A decoder or a look-up-table circuit 226 may be used to provide an input signal to a current DAC 230 which may then adjust the value of the charge-pump current provided from the charge pump 206 such that it cancels the process variation of the oscillator gain. The current DAC may be a controlled current mirror that takes on input (reference) current, creates a set of mirror currents that are linearly related to the input current, and then sums them up based on the digital control code provided by the frequency decoder or look up table. To achieve a process independent Kvco*Icp term it is desirable that the charge-pump DAC input current be calibrated or have a very stable value over process. In large ASICs a high accuracy bias current is generally already available as such circuits are often utilized in other circuit blocks.

Applying a known control signal voltage or current to the oscillator (derived usually from a stable bandgap reference) and measuring the output frequency represents in fact a direct measurement of the oscillator gain (Kvco or Kico).

As the loop bandwidth and damping factor are tuned simultaneously it is desirable to tune a circuit element that appears in the same position (either at numerator or at denominator) in both equations such that the change is applied in the same direction. Furthermore it is desirable that considered tuning element has the same impact (power) as the Kvco term on the loop bandwidth and damping factor expressions. The single element that satisfies both these conditions is the charge-pump current (Icp). In this manner a single step calibration may be performed that tunes both the loop bandwidth and the damping factor.

Once the Kvco*Icp term is process independent the element that may contribute the most process variation to the loop bandwidth is the loop filter stabilizing zero resistance (R). Thus, it may be desirable to provide a highly accurate resistor for use in the loop filter 108. One approach is to utilize a resistor that may be trimmed. One technique to achieve process independent bandwidth is to calibrate the loop filter resistor (for example using register trimming to the value of a high precision external resistor). The calibration of the resistor can be done either before or after the charge-pump tuning as it does not impact the open-loop output frequency measurement.

There are several ways of calibrating a resistor. One example as shown in FIG. 2 is to inject the same current in both a high precision external resistor 240 (Rext) and in an adjustable internal resistor 242 (Rint). The internal resistor desirably matches the loop filter resistor 250. A voltage comparator 244 (Comp) compares the voltages on the two resistors and drives a DAC 246 that changes the value of internal resistor 242 (Rint) in the direction of making the two voltages equal within a given error margin. If the loop filter resistor 250 is made-up of the same unit resistors and with the same orientation as the calibrated internal resistor 242 Rint resistor (they match reasonable well) then the same switching code used by internal resistor 242 (Rint) may then be applied to the loop filter resistor 250 to calibrate-out the process variation of the loop filter resistor 250.

Though advantageous, the single step open loop calibration technique described above does not require the resistor calibration technique described herein. The two step open loop calibration technique described below may similarly utilize a loop filter resistor calibration technique, but likewise such resistor calibration is not required.

With Kvco*Icp and R terms being process independent the loop bandwidth results also virtually process independent (within the error margins/resolutions of the calibration processes that were used).

Analyzing the damping factor expression and considering R and Kvco*Icp process independent, the single process variation left comes from the Ci integral loop filter capacitor. In most processes the capacitor variation is of the order of ±20% ... ±25% that results in a ±10% ... ±12% variation of the damping factor. Considering also the calibration errors (both in R and Icp) the overall variation of the loop bandwidth is around ±3% ... ±5% while the damping factor process variation is around ±12% ... ±15%. This partial compensation of the process variation of both the loop bandwidth and damping factor is good enough for most low-end and middle range PLL applications.

In the case of the feed-forward loop filter PLL using a current controlled oscillator, the loop bandwidth and damping factors are given by:

$$\xi = \frac{1}{2} \cdot \frac{\omega n}{\omega z} = \frac{kip}{2} \cdot \frac{Icpp}{Icpi} \sqrt{\frac{Kico \cdot Icp \cdot Ci \cdot Ri}{2\pi \cdot N}} \quad (15)$$

$$\omega_c = \frac{\omega n^2}{\omega z} = \frac{Ri \cdot Kico \cdot Icpp \cdot Kip}{2\pi \cdot N} \quad (16)$$

Where Ri is the resistor used to convert the integral loop filter voltage into a current.

A similar single measurement open loop calibration architecture can be used for the feed-forward loop filter PLL as was described above with regard to the passive RC loop filter. In such an approach, the charge-pump current (both integral Icpi and proportional Icpp) are tuned using a current DAC based on the open-loop output frequency measurement, while the integral path resistor used to perform the voltage to current conversion that gives the integral path gain is calibrated separately (e.g. to a high precision external resistor). The Kip proportional path gain and the Icpp/Icpi charge-pump current ratio have negligible process variations, such that the PLL loop bandwidth result is virtually process independent.

If the charge-pump current used to calibrate-out the oscillator gain process variation is obtained from a stable bandgap voltage (Icpp=k*Icpi=Vbg/Rbg) then the process variation of the loop filter resistance is canceled out by the charge-pump current process variation due to Rbg (well matched with the loop filter Ri resistor). Therefore it is not needed to have an additional step of loop filter resistor calibration. This method consists of a combination of the open-loop calibration and the bandgap referencing technique, resulting in a significant reduction of the calibration circuit complexity.

Similarly to the passive RC filter case, the damping factor has a residual variation due to the loop filter integral capacitor (Ci) process variation.

In the case of feed-forward loop filter PLLs using a voltage controlled oscillator, the loop bandwidth and the damping factor are given by:

$$\xi = \frac{1}{2} \cdot \frac{\omega n}{\omega z} = \frac{Rp}{2} \cdot \frac{Icpp}{Icpi} \sqrt{\frac{Kico \cdot Icp \cdot Ci}{2\pi \cdot N}} \quad (17)$$

$$\omega_c = \frac{\omega n^2}{\omega z} = \frac{Kico \cdot Icpp \cdot Rp}{2\pi \cdot N} \quad (18)$$

where Rp is the resistor that converts the proportional control current into a voltage. If the Rp resistor is calibrated to a known value, then tuning the two charge-pump currents (Icpi and Icpp) to compensate the oscillator gain process variation provides a process independent loop bandwidth and a low variation for the damping factor.

Alternatively in the case of a feed forward loop filter PLL with a current controlled oscillator, if the charge-pump current used to calibrate-out the oscillator gain process variation is obtained from a stable bandgap voltage (Icpp=k*Icpi=Vbg/Rbg) then the process variation of the loop filter resistance is canceled out by the charge-pump current process variation due to Rbg (well matched with the loop filter Rp resistor). Again a combination of the open-loop calibration and the bandgap referencing technique was used, resulting in a significant reduction of the calibration circuit complexity.

One drawback of the loop bandwidth calibration technique based on a known control signal (voltage or current) and the result of the output frequency measurement is that it can compensate only for the process variation of the oscillator gain. The charge-pump current is varied to compensate for the oscillator gain variation, but the charge-pump current can have a process variation of its own that is not compensated. Therefore a process independent current needs to be used as charge-pump current. One way to generate such a current is based on a bandgap voltage and a calibrated resistor: Icp=Vbg/Rcal. Alternatively a combination between the open-loop single step calibration and they bandgap referencing technique for the charge-pump current can be used to take out the loop filter resistor and charge pump current calibration step.

The complexity of the single step calibration circuit is rather low (consists of three DACs: one capacitor DAC for the VCO gain adjustment, one resistor DAC for the loop filter resistor tuning, and one current DAC for the charge-pump current setting) one frequency measurement counter with the associated output decoder and the miscellaneous digital control block that opens and closes the PLL loop, provide the gating signal for the frequency measurement and generates all the power down and enable/disable signals required by the calibration process.

II. High Accuracy Two Steps Open-loop Calibration Technique

Figure 3:
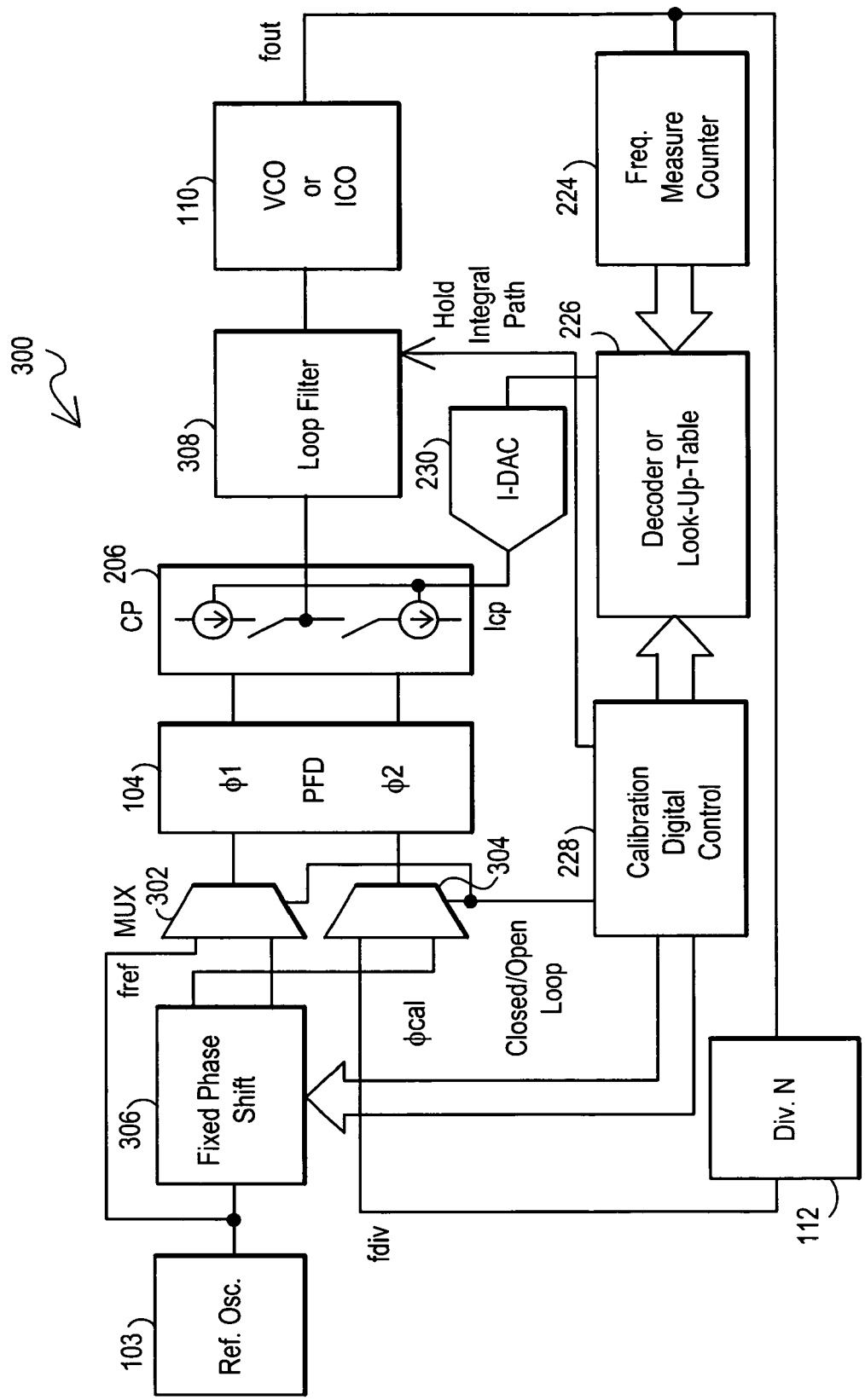
FIG. 3 illustrates a PLL for use with a two step open loop calibration technique providing circuit detail for the loop bandwidth calibration step.
Figure 5:
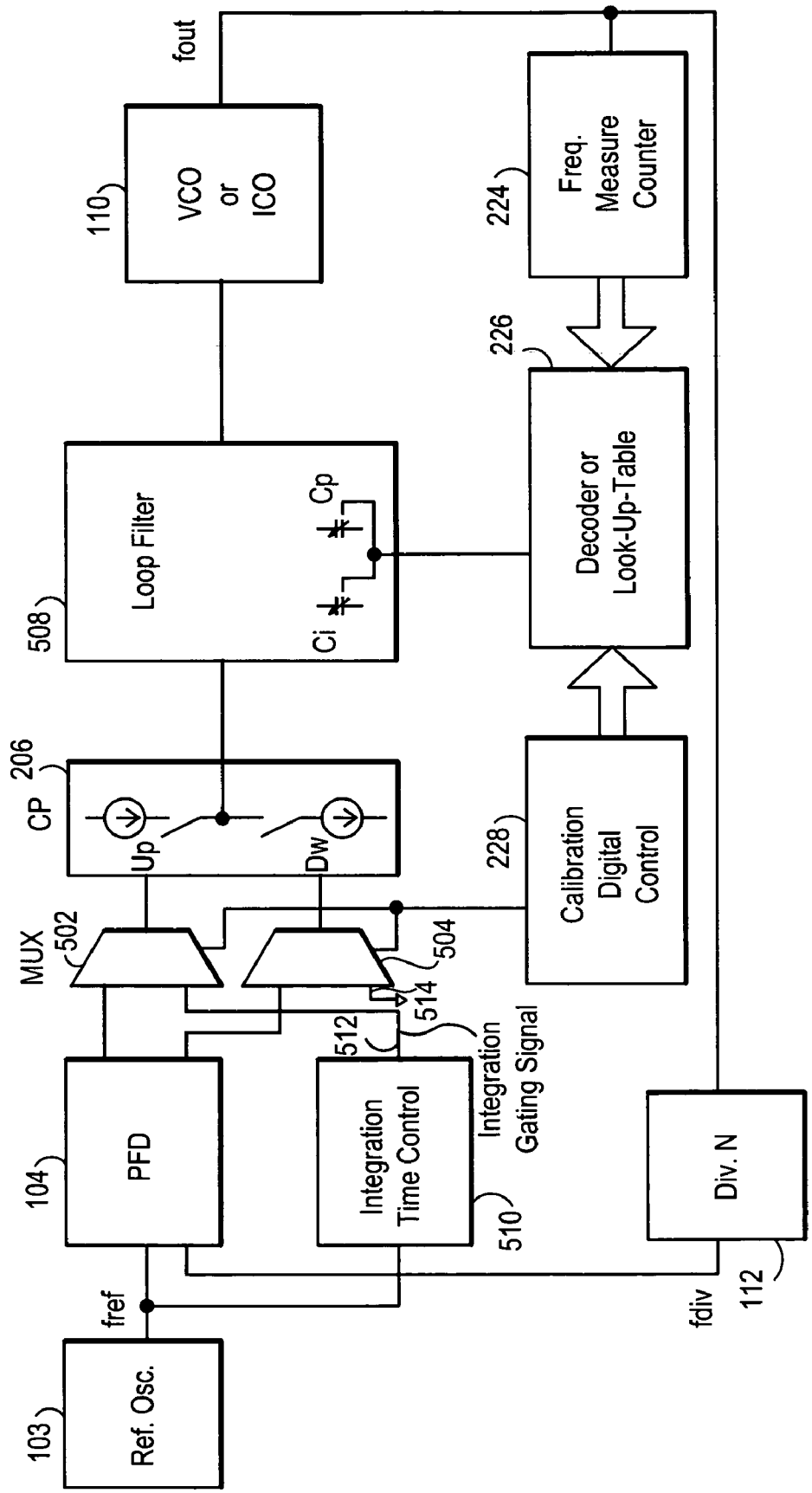
FIG. 5 illustrates a PLL for use with a two step open loop calibration technique providing circuit detail for the loop damping factor tuning calibration step.

For a more accurate loop bandwidth calibration, it may be desirable for the calibration to include measurement of the open loop gain rather than just the oscillator gain. More particularly, to be able to more accurately calibrate both the loop bandwidth and the damping factor, it may be desirable to utilize two orthogonal measurements and two independent tuning processes (the second element that is tuned should not impact the first calibration step). More particularly, a two step open loop calibration process may be utilized. One step may include calibration of the PLL loop bandwidth and the other step may include calibration of the PLL loop damping factor. In one embodiment, the loop bandwidth calibration may be performed first and then the damping factor calibration. As described below the first step may accomplish PLL loop bandwidth tuning by adjusting the charge pump current and the second step may accomplish PLL loop damping tuning by adjusting the loop filter capacitors. For ease of understanding, exemplary circuitry for accomplishing the first step is illustrated in FIG. 3 and exemplary circuitry for accomplishing the second step is illustrated in FIG. 5. It will be recognized however that a PLL that utilizes a two step open loop calibration process may include the circuitry shown in both FIG. 3 and FIG. 5.

A. Loop Bandwidth Calibration Step

FIG. 3 presents the loop bandwidth step of a two step open loop calibration technique that involves the measurment of the entire forward loop gain. The PLL 300 of FIG. 3 shares some common features to the PLL of FIG. 2 including the reference oscillator 103, phase frequency detector 104, charge pump 206, loop filter 308, controlled oscillator 110, divider 112, frequency counter 224, decoder or look-up table 226, calibration control circuitry 228 and current DAC 230. However, the feedback loop is opened in this case before the phase-frequency-detector 104 by using two MUXs: mux 302 for the reference clock path and mux 304 for the feedback clock path. In normal operation, the muxes copy to their output the reference (fref) and feedback (fdiv) clock signals ensuring the closed loop nature of the PLL. In the calibration mode, the muxes provide to the PFD 104 two signals from the fixed phase shift circuitry 306. These two signals are used as calibration clocks that are derived from the reference clock and that have a known phase difference between them (e.g. $\Delta\Phi=\pi/8$ or $\pi/16$, or any other number that can be easily generated). The PLL 300 includes also a calibration control circuitry 228 that generates all the controlsignals required by the calibration algorithm described in more detail below. Thus in calibration mode, the calibration control circuitry 228 controls the muxes 302 and 304 to provide to the PFD 104 the calibration clocks that are generated by the fixed phase shift circuitry 306.

The fixed phase shift circuitry 306 may be any circuitry that is able to generate two values for the phase shift ($\Delta\Phi1$ and $\Delta\Phi2$) such that two distinct measurements of the output frequency can be realized. Having two points on the transfer function (assumed linear) the slope can be computed, which gives the forward path gain.

One solution is to generate a positive ($\Delta\Phi>0$) and a negative ($\Delta\Phi<0$) phase shift that have the same magnitude. This may ease the generation of the calibration clocks as the second set can be obtained by simply swapping the order of the two clocks. However any other combinations of two phase shifts are acceptable for the forward gain measurement.

During the bandwidth measurement the integral portion of the oscillator control signal coming from the loop filter should be held to a constant value, such that only the proportional path drives the oscillator. The calibration control circuitry 228 may provide a control signal to the loop filter 308 such that the integral portion of the control signal may be held to a constant value.

The loop bandwidth calibration algorithm may comprise:
    opening the PLL feedback loop by switching the two input MUXs on the calibration mode;
    power-down the phase-frequency-detector and disable the integral charge-pump in the case of a feed-forward loop filter architecture;
    hold the integral path in the loop filter to a fixed value;

apply the first phase shift between the two calibration clocks (ΔΦ1) and measure the frequency at the oscillator output (fout1). One way to measure the frequency is using a counter that counts during a known period of time set for example by an integer number of reference clock cycles and store its final value into a register;

apply the second phase shift (ΔΦ2), measure the oscillator's output frequency and store the result (fout2) into a second register;

compute the forward path gain (FG) while the integral path is held constant:

$$Gf = \frac{fout2 - fout1}{2\pi \cdot (\Delta\Phi 2 - \Delta\Phi 2)} \quad (19)$$

The loop bandwidth is equal to the forward path gain divided by the feedback divider modulus in this special case when the integral path is held to a constant value:

$$BW = \omega c = \frac{Gf}{N} \quad (20)$$

based on the loop bandwidth calculation change the charge-pump current using a current DAC such that the process variation of the loop bandwidth is canceled out.

The loop bandwidth for a PLL using a passive RC loop filter is given by:

$$BW = \omega c = \frac{R \cdot Icp \cdot Kvco}{2\pi \cdot N} \quad (21)$$

This loop bandwidth calibration algorithm tunes the R*Icp*Kvco term to a constant value by changing the Icp charge-pump current such that the loop bandwidth is process independent.

If the loop filter series resistor is calibrated (e.g. to a high precision external resistor such as described above), than the loop bandwidth calibration step can be viewed as a tuning of the charge-pump current such that the Icp*Kvco product stays constant (process independent).

Alternatively if the charge-pump bias current that drives the current DAC 230 that adjusts the charge-pump output current is derived from a stable bandgap voltage through a V-to-I conversion using an on-chip resistor, then the R*Icp term becomes process independent and thus it is not necessary to calibrate the loop filter resistor, simplifying the calibration circuit complexity.

Figure 4A:
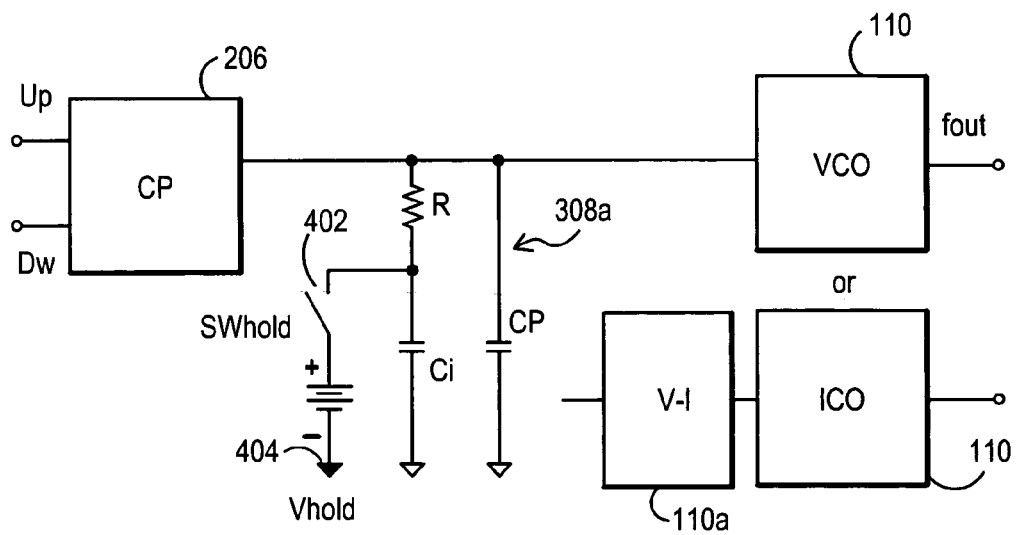
FIGS. 4a–4b illustrate exemplary circuits to implement integral path holding during the loop bandwidth calibration step.
Figure 4B:
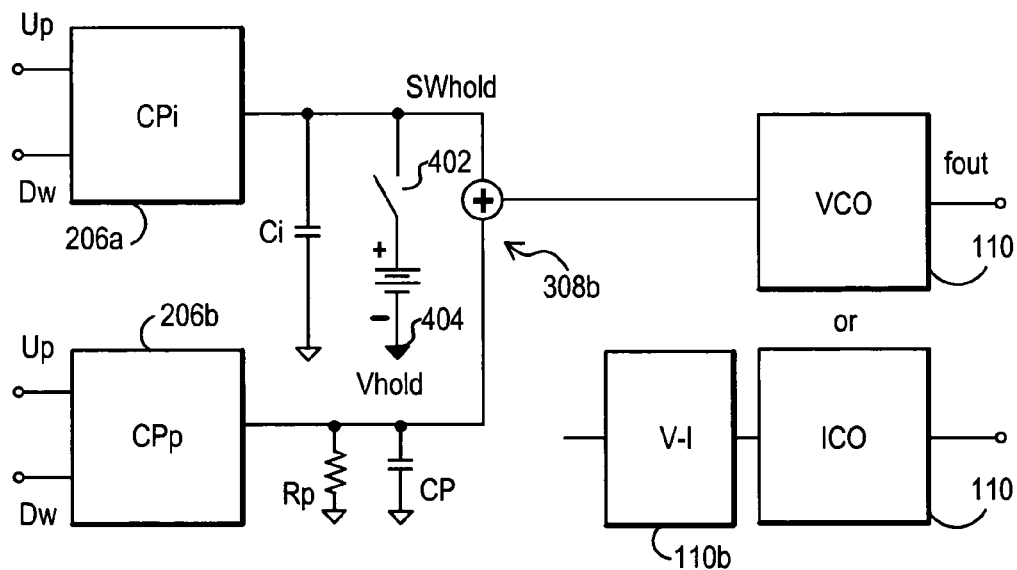

FIG. 4.a shows one embodiment of a passive RC loop filter 308a that includes circuitry to hold the integral component of the oscillator control signal to a known value. To do this an additional switch 402 (SWhold) shunts the Ci integral capacitance to a known voltage 404 (Vhold) under control of the calibration control circuitry 228. The Vhold voltage is usually selected such that it places the oscillator in the middle of its tuning range. This allows the maximum frequency variation in both positive and negative directions and thus makes possible the operation with large phase differences between the two calibration clocks. The larger the phase shift value is, the easier it is to generate the two calibration clocks but also the larger the frequency shift during the bandwidth calibration process. It is desirable that the phase shift is lower than the maximum value that generates a control signal outside the oscillator's tuning range. As shown in FIG. 4a, the oscillator 110 may be a voltage controlled oscillator or may alternatively be a current controlled oscillator. In the current controlled oscillator a voltage to current converter 110a may be used as the front end of the oscillator.

FIG. 4.b presents a second embodiment of the integral path hold circuit suitable for the feed-forward loop filter architectures 308b. In this case two separate signal paths exist: the integral one built with the integral charge-pump 206a (CPi) and the integration capacitance (Ci) and the proportional path realized with the proportional charge-pump 206b (CPp), the proportional resistor (Rp) and the ripple pole capacitance (Cp). The two control signals (the integral and the proportional components) are summed together and control the oscillator. The summation process can be done either in the loop filter or in the oscillator. In the case of a current controlled oscillator an additional voltage-to-current converter stage 110b needs to be introduced as shown. To hold the integral path the integral charge-pump is powered down or disabled and the integral capacitor (Ci) is shunted with SWhold switch 402 to the Vhold constant voltage 404.

The main advantages of this second embodiment of the open-loop PLL bandwidth calibration algorithm is that it measures the loop bandwidth (not only the oscillator gain) and is able to compensate for all the process variations that appear in the forward signal path (charge-pump current, loop filter resistance and oscillator gain).

For the loop bandwidth calibration in this embodiment it is not necessary to calibrate the loop filter resistance. As will be shown later, from the damping factor calibration standpoint, it is desirable that the loop filter resistance is calibrated and therefore such calibration may be advantageously done prior to the loop bandwidth calibration step.

The resistor calibration can be eliminated if the charge-pump bias current that goes to the DAC that adjusts the output current to compensate for the loop gain variation is given by:

VbgIRbg² for the passive RC loop filter

Vbg/R for the feed-forward loop filter PLL.

In the first case the loop bandwidth will still have some residual process variation (as the loop filter resistor and the charge-pump current appear with different powers in the two expressions) but the damping factor results process independent. In the second case both loop bandwidth and damping factor result process independent as the loop filter resistor and the charge-pump current appear with the same power in both expressions.

b. Damping Factor Calibration Step

In the case of the passive RC loop filter the damping factor is given by:

$$\xi = \frac{1}{2} \cdot \frac{\omega n}{\omega z} = \frac{R}{2} \sqrt{\frac{Kvco \cdot Icp \cdot Ci}{2\pi \cdot N}} \quad (22)$$

In the loop bandwidth expression the resistor R appeared directly multiplied with the Kvco*Icp term, while in the damping factor expression the resistor R is multiplied by the square root of that term ($\sqrt{Kvco \cdot Icp}$). Therefore even if the loop bandwidth process variation was eliminated in the first step of the calibration (Kico*Ico*R is constant) this still gives a process variation of the R·√Kvco·Icp term.

In addition to this variation due to the on-chip resistance, the damping factor has a residual variation due to the integral capacitor (Ci) process variation. The fact that the Ci capacitance impacts the damping factor value, but does not influence the loop bandwidth value offers the solution for an independent (orthogonal) tuning of the loop bandwidth and damping factor, such that the calibration can be done in two consecutive steps, without needing readjustments.

To eliminate the process variation of the damping factor due to the variation of the loop filter resistance, the loop filter resistance should be calibrated prior to the loop bandwidth calibration step. One solution is to calibrate it to a high precision external resistor. Once the R term and the √Kvco·Icp term are process independent, the single variation left in the damping factor expression is due to the integral loop filter capacitance (Ci).

To achieve a process independent damping factor it is desirable to measure the value of the loop filter integral capacitance and then tune it to a desired value that brings the required value for the damping factor.

FIG. 5 presents one possible embodiment of the open-loop measurement of the integral capacitance and the means to tune the damping factor to the desired value. As shown in FIG. 5, the PLL loop may be opened after the PFD 104 by the use of muxes 502 and 504. In normal operation mode the muxes 502 and 504 provide the outputs of the PFD 104 to the charge pump 206. In a damping factor calibration mode, an output 512 of an integration time control circuit 510 is provided as an output of mux 502 and a ground input 514 is provided as an output of mux 504. The key idea to a loop filter capacitance measurement is to generate a control signal to the oscillator that is dependent on the Ci capacitance value and then measure the output frequency of the oscillator. During this measurement the proportional component of the control signal should be eliminated.

In the passive RC loop filter case, if there is no charge-pump current injected into the RC filter, there is no voltage drop on the resistor R and therefore there is no proportional control signal. The single control signal to the oscillator is the integral component given by the voltage stored on the Ci capacitor.

To achieve an integral control voltage that is proportional to the Ci capacitance value, first the loop filter is reset to zero and then the pump-up charge-pump current Icp is injected in the loop filter during a known period of time (Tint). An easy way to generate an accurate time interval is counting a given number of reference clock cycles: Tint=p*Tref. To accomplish this, the muxes 502 and 504 are switched to the calibration mode and the output 512 of the integration time control circuit is provided from the integration time control circuit for this time interval. The integration time period should generally be long enough such that the voltage on Ci is at mid-supply values. Very small values or very large values may lead to control voltages outside the oscillator tuning range.

The resulting value for the integral capacitor voltage is:

$$Vint = Tint \cdot \frac{Icp}{Ci} \quad (23)$$

After the integration period has ended, the charge-pump is turned-off and the voltage drop on the loop filter resistor drops to zero. As a consequence the oscillator is controlled only by the integral component.

Assuming a negligible leakage current from the integral loop filter capacitor during the measurement time, the control voltage of the oscillator stays at the Vint level. The resulting output frequency of the oscillator is given by:

$$fout = Kvco \cdot Vint = Kvco \cdot Tint \cdot \frac{Icp}{Ci} \quad (24)$$

From the previous calibration step the Kvco·Icp term was tuned to a known value and the Tint integration time is also a constant and known value. The single unknown from the equation (20) is the loop filter integral capacitance. Therefore the measurement of the oscillator output frequency when driving it by the Vint voltage is a direct indication of the value of the Ci capacitance. Based on the digital number from the frequency measurement counter 224, the Ci loop filter capacitance is tuned using for example a capacitor DAC controlled by a logic decoder or a look-up-table 226 that maps the values of the measured frequency to the loop filter capacitance values for a given target damping factor value.

Figure 6A:
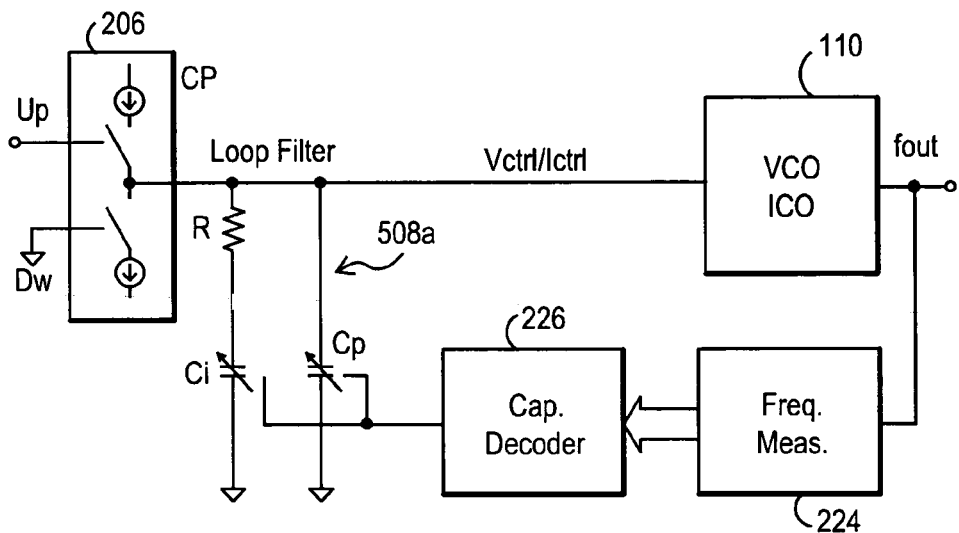
FIGS. 6a–6b illustrate exemplary circuits to implement proportional path holding during the loop damping factor calibration step.
Figure 6B:
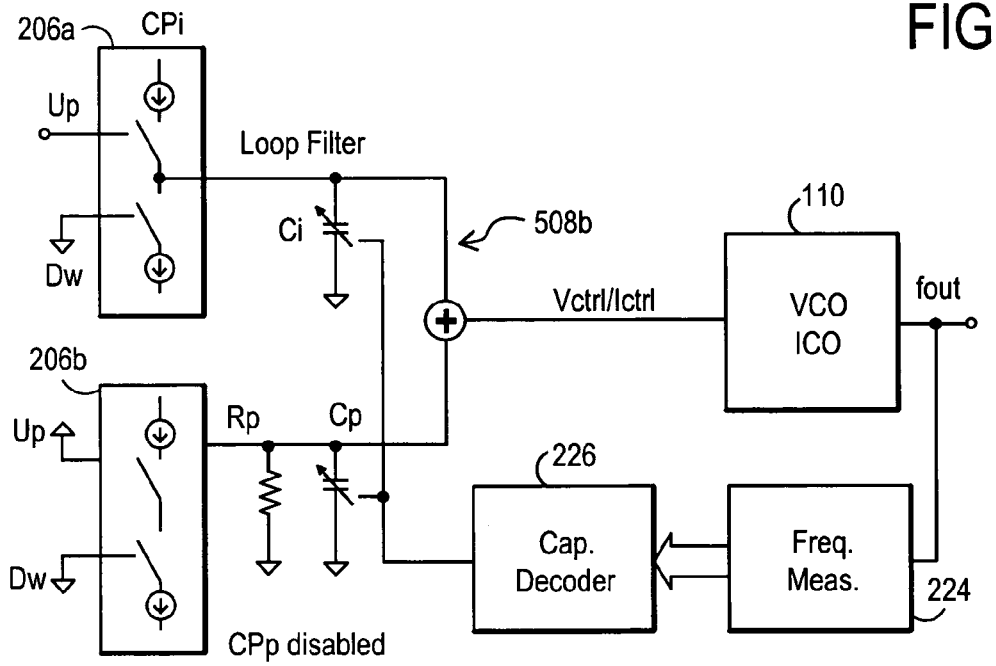

FIG. 6.a shows a detail of a passive RC loop filter 508a for the damping factor calibration step. The pump-down section of the charge-pump is disabled and the pump-up section is enabled during a predefined time interval Tint. To keep a constant pole-zero separation ratio, the ripple-pole capacitance (Cp) needs to be changed proportional with the integral capacitance change (Ci) using the same digital control signal for the two capacitor DACs. The frequency measure counter 224 and capacitor decoder / look up table 226 provide the digital control to the variable capacitors.

FIG. 6.b presents the corresponding damping factor calibration architecture for the feed-forward loop filter 508b case. During this second calibration step the proportional charge-pump 206b is completely disabled. Also the pump-down section of the integral charge-pump 206a is disabled. Only the pump-up section of the integral charge-pump 206a is activated during the known integration time interval (Tint). The rest of the architecture is similar to the one used for the passive RC loop filter case, using a frequency measurement counter 224, a damping factor decoder or look-up-table 226 that controls the two capacitor DACs (Ci and Cp) and a digital control signal generation block that drives the entire calibration process.

In the case of a feed-forward loop filter PLL using a current controlled oscillator, the damping factor is given by:

$$\xi = \frac{1}{2} \cdot \frac{\omega n}{\omega z} = \frac{Kip}{2} \cdot \frac{Icpp}{Icpi} \sqrt{\frac{Kico \cdot Icpi \cdot Ci \cdot Ri}{2\pi \cdot N}} \quad (25)$$

Wher gmi=1/Ri is the gain of the integral path degenerated to the Ri resistance.

If Ri is calibrated to a known value (e.g. a high precision external resistor) and Kvco . Icpi was tuned to a known value during the loop bandwidth calibration step (Icpi is tuned together with Icpp in the first step such that their ratio stays constant) then again the damping factor process variation can be canceled out by adjusting the value of the integral loop filter capacitance.

In the case of a feed-forward loop filter PLL using a voltage controlled oscillator the damping factor is given by:

$$\xi = \frac{1}{2} \cdot \frac{\omega n}{\omega z} = \frac{Rp}{2} \cdot \frac{Icpp}{Icpi} \sqrt{\frac{Kvco \cdot Icpi \cdot Ci}{2\pi \cdot N}} \quad (26)$$

Where Rp is the resistor that converts the proportional path current into voltage. The Kip current gain of the proportional path can be realized with a negligible process variation (e.g. using a current mirror). The ratio of the two charge-pump currents has also a very low process variation.

Assuming the Rp resistance was calibrated (e.g. to a high precision external resistor, or any other means) and the Kvco·Icpi term was tuned to a known value during the loop bandwidth calibration step, the damping factor can be tuned out by adjusting the Ci value based on the output frequency measurement during the second calibration step. Alternatively in the case of a feed forward loop filter PLL with a current controlled oscillator, if the charge pump current is referenced to the bandgap voltage using a V-to-I conversion (Icp=Vbg/Rbg) and the Rbg resistor matches the loop filter resistor (e.g. Ri) then both the charge pump and loop filter resistor process variations are canceled out.

In conclusion, the high accuracy second embodiment of the open-loop calibration technique which has a two step bandwidth/damping calibration process offers a virtually process independent loop bandwidth and damping factor. It consists in the following steps:

- calibrate the loop filter resistor (or use the bandgap referencing technique for the charge-pump current);
- calibrate the loop bandwidth by adjusting the charge-pump current such that the Kvco·Icpi term becomes process independent;
- calibrate the damping factor by adjusting the value of the integral loop filter capacitor.

All the measurements are performed in open-loop mode and the calibration has no detrimental effects on the PLL operation in closed-loop mode (normal operation).

III. Divider Modulus Independence

Figure 7A:
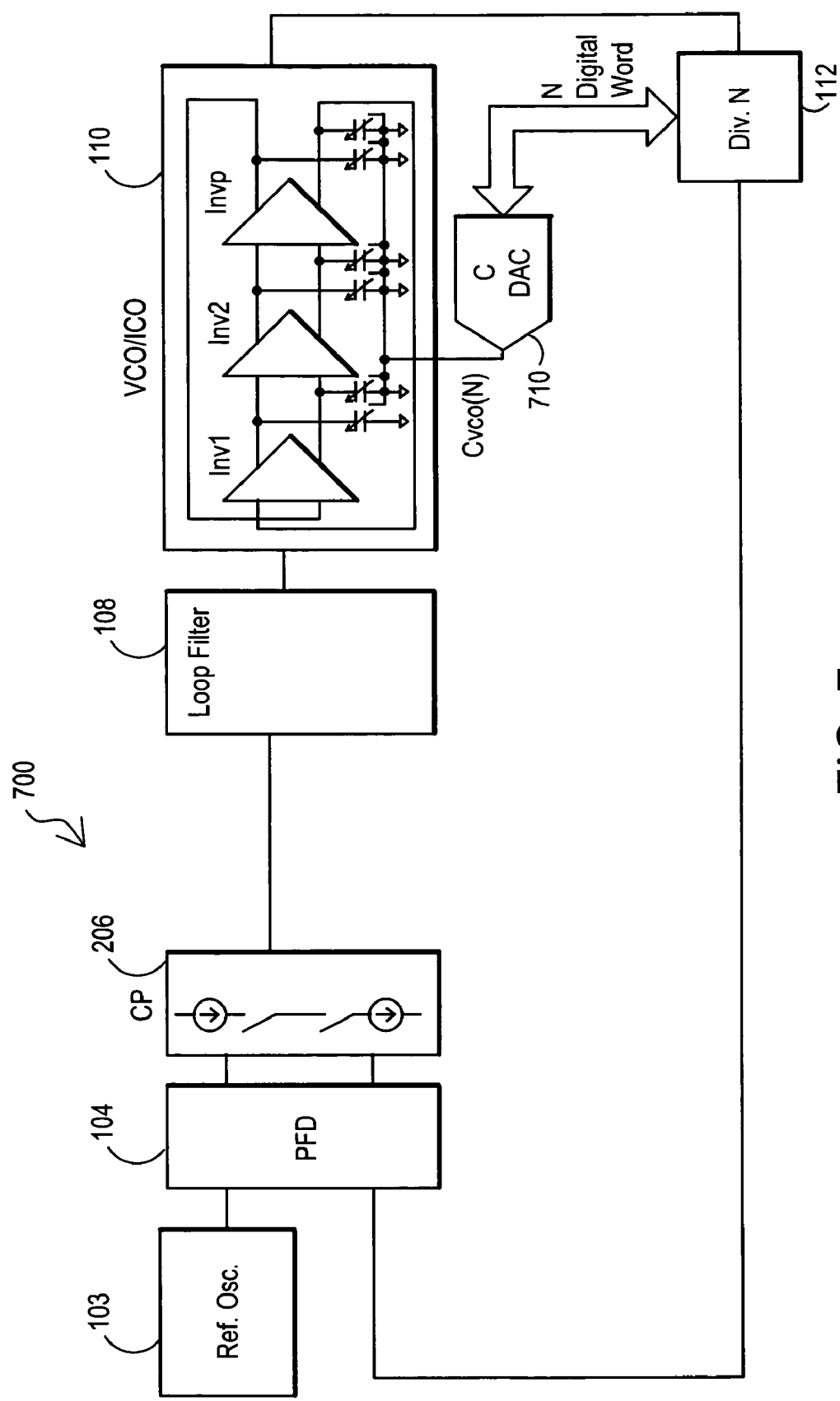
FIGS. 7a–7b illustrate N divider modulus independent PLL techniques.
Figure 7B:
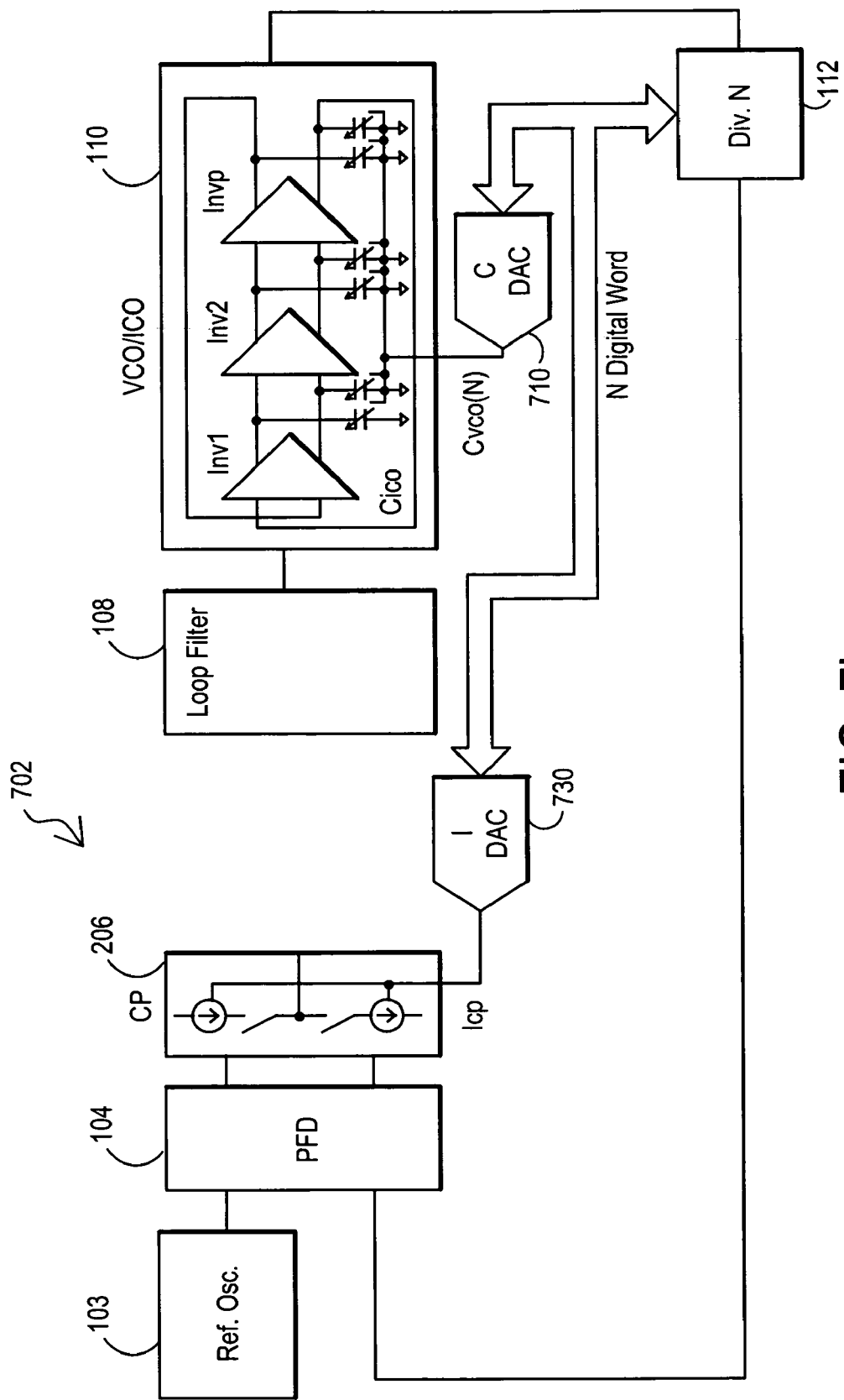

The loop bandwidth and damping factor calibration techniques described above may also be advantageously utilized with a technique that makes the loop bandwidth and damping factor to be independent of the divider modulus N. More particularly, the calibration techniques discussed above may be used in combination with an oscillator gain switching technique that changes the Kvco term proportional with the N feedback divider modulus such that the Kvco/N term becomes N independent (for example see PLL 700 of FIG. 7a and PLL 702 of FIG. 7b). The gain of the oscillator is changed proportionally by switching in or out capacitors (Cvco) at the output of the oscillator amplifier (ring inverter) under control of the C DAC 710 (Kvco is proportional to 1/Cvco and is proportional to N and therefore Kvco/N is independent of N). This makes both the damping factor and the loop bandwidth to be N modulus independent:

$$bw = \omega c \propto \frac{Kvco}{N} \quad (N \text{ independent}) \quad (27)$$

$$\xi \propto \sqrt{\frac{Kvco}{N}} \quad (N \text{ independent}) \quad (28)$$

This technique is well suited for PLLs having a narrow to moderate N modulus range (one or two octaves of variation). Changing the oscillator gain more than a factor of 4 while ensuring a high resolution increases the complexity of the oscillator capacitors switching circuit and reduces the maximum operating frequency (troublesome particularly in the multi-GHz oscillators). In the case of a wide N modulus range an alternative solution is shown with PLL 702 that uses a combined oscillator gain and charge-pump current switching technique such that Kvco*Icp/N is kept N independent (see FIG. 7b) under control of both C DAC 710 and I DAC 730. This ensures an optimal compromise between maximum oscillating frequency and the reference spurs performance (it is desirable to have relatively low charge pump currents to keep the switching parasitic effects negligible). Though shown in FIG. 7b as two separate DACS, DACS 710 and 730 may be implemented as one DAC from which the MSBs control the oscillator capacitor selection and the LSBs control the charge pump current.

The N divider modulus independent PLL architectures belong to the closed loop calibration techniques as the PLL loop stays all the time closed. Also these techniques can be considered as continuous calibration methods as they may be applied all the time. However, in contrast with the self-biasing process independent technique (discussed in the background above) where calibration signals change during the transient regime of the PLL, in the divider modulus independent scheme the oscillator gain and/or charge pump reference current value are changed only at the beginning of a locking process when the N modulus is changed (change the communication channel). After that initial time they stay constant for the entire period of operation on the selected channel (given N value). Therefore the N modulus independent calibration loop is opened during the normal operation time and there are no detrimental effects such as start-up or nonlinear stability issues.

Further modifications and alternative embodiments of this invention will be apparent to those skilled in the art in view of this description. The techniques disclosed herein may be utilized for a wide range of PLL configurations and are not meant to be limited to any particular PLL configuration. For example, one possible PLL configuration is disclosed in U.S. patent application Ser. No. 11/024,025, entitled "Method and Apparatus to Reduce the Jitter in Wideband PLL Frequency Synthesizers Using Noise Attenuation" by Adrian Maxim and James Kao, filed concurrently with the present application, the disclosure which is expressly incorporated herein by reference. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein and certain features of the invention may be utilized independently of the use of other features, all as would be apparent to one skilled in the art after having the benefit of this description of the invention.

What is claimed is:

1. A method of calibrating a phase locked loop circuit, comprising
opening the loop of the phase locked loop circuit;
applying a known signal at at least one point of the phase locked loop circuit while the phase locked loop circuit is in an open loop condition;
measuring a frequency of at least one clock signal that results when the known signal is applied in the open loop condition; and
performing at least one calibration adjustment based upon a difference between the measured frequency and an expected frequency,
wherein the calibration adjustment provides corrective action for both a phase locked loop bandwidth and phase locked loop damping factor.

2. The method of claim 1 wherein the calibration adjustment corrects process and temperature variations.

3. The method of claim 1 wherein the known signal is applied as a charge pump output signal.

4. The method of claim 3 wherein the calibration adjustment comprises adjusting a closed loop charge pump output of the phase locked loop circuit.

5. The method of claim 1, wherein the known signal is a first known signal, the method further comprising:
applying a second known signal to the phase locked loop circuit while the phase locked loop circuit is in an open loop condition;
measuring a second frequency of at least one clock signal that results when the second known signal is applied in the open loop condition;
performing a second calibration adjustment based upon a difference between the second measured frequency and a second expected frequency.

6. The method of claim 5 wherein at least one of the first known signal and the second know signal is utilized to provide a loop bandwidth calibration.

7. The method of claim 5 wherein at least one of the first known signal and the second know signal is utilized to provide a damping factor calibration.

8. The method of claim 5 wherein the first known signal is utilized to provide a loop bandwidth calibration.

9. The method of claim 8 wherein the second known signal is utilized to provide a damping factor calibration.

10. The method of claim 5 wherein the first known signal is applied to an input of a phase detector and the calibration adjustment comprises adjusting the charge pump output during closed loop conditions of the phase locked loop circuit.

11. The method of claim 10 wherein the second known is signal is applied as an input to a charge pump and the second calibration adjustment comprises adjusting a closed loop condition of a loop filter.

12. The method of claim 1 wherein the known signal is applied to an input of a phase detector and the calibration adjustment comprises adjusting the charge pump output during closed loop conditions of the phase locked loop circuit.

13. The method of claim 1 wherein the known is signal is applied as an input to a charge pump and the calibration adjustment comprises adjusting a closed loop condition of a loop filter.

14. The method of claim 1 further comprising changing an oscillator gain proportionally to a feedback divider modulus.

15. A phase locked loop circuit, comprising:
a loop path within the phase locked loop circuit;
a switchable circuit element connected within the loop path to selectively open the loop path for performing a calibration of the phase locked loop circuit;
at least one known calibration signal coupled to the switchable circuit element, the known calibration signal selectively provided to the phase locked loop circuit for open loop measurements;
a frequency measurement circuit coupled to a clock signal generated by the phase locked loop circuit; and
calibration adjustment circuitry coupled to the frequency measurement circuit and at least one portion of the phase locked loop circuit, the calibration adjustment circuitry providing closed loop calibration of the phase locked loop circuit based upon open loop measurements,
wherein the calibration adjustment circuitry provides corrective action for both a phase locked loop bandwidth and phase locked loop damping factor.

16. The circuit of claim 15 wherein the known calibration signal is provided as a charge pump output.

17. A phase locked loop circuit, comprising:
a loop path within the phase locked loop circuit;
a switchable circuit element connected within the loop path to selectively open the loop path for performing a calibration of the phase locked loop circuit;
at least one known calibration signal coupled to the switchable circuit element, the known calibration signal selectively provided to the phase locked loop circuit for open loop measurements;
a frequency measurement circuit coupled to a clock signal generated by the phase locked loop circuit; and
calibration adjustment circuitry coupled to the frequency measurement circuit and at least one portion of the phase locked loop circuit, the calibration adjustment circuitry providing closed loop calibration of the phase locked loop circuit based upon open loop measurements,
wherein the known calibration signal is provided as at phase detector input.

18. A phase locked loop circuit, comprising:
a loop path within the phase locked loop circuit;
a switchable circuit element connected within the loop path to selectively open the loop path for performing a calibration of the phase locked loop circuit;
at least one known calibration signal coupled to the switchable circuit element, the known calibration signal selectively provided to the phase locked loop circuit for open loop measurements;
a frequency measurement circuit coupled to a clock signal generated by the phase locked loop circuit; and
calibration adjustment circuitry coupled to the frequency measurement circuit and at least one portion of the phase locked loop circuit, the calibration adjustment circuitry providing closed loop calibration of the phase locked loop circuit based upon open loop measurements,
wherein the known signal calibration signal is provided at a charge pump input.

19. A phase locked loop circuit, comprising:
a loop path within the phase locked loop circuit;
a switchable circuit element connected within the loop path to selectively open the loop path for performing a calibration of the phase locked loop circuit;
at least one known calibration signal coupled to the switchable circuit element, the known calibration signal selectively provided to the phase locked loop circuit for open loop measurements;

a frequency measurement circuit coupled to a clock signal generated by the phase locked loop circuit; and calibration adjustment circuitry coupled to the frequency measurement circuit and at least one portion of the phase locked loop circuit, the calibration adjustment circuitry providing closed loop calibration of the phase locked loop circuit based upon open loop measurements, wherein the calibration adjustment circuitry adjusts the charge pump output during closed loop conditions.

20. A phase locked loop circuit, comprising:

a loop path within the phase locked loop circuit;

a switchable circuit element connected within the loop path to selectively open the loop path for performing a calibration of the phase locked loop circuit;

at least one known calibration signal coupled to the switchable circuit element, the known calibration signal selectively provided to the phase locked loop circuit for open loop measurements;

a frequency measurement circuit coupled to a clock signal generated by the phase locked loop circuit; and calibration adjustment circuitry coupled to the frequency measurement circuit and at least one portion of the phase locked loop circuit, the calibration adjustment circuitry providing closed loop calibration of the phase locked loop circuit based upon open loop measurements, wherein the calibration adjustment circuitry adjusts an element of a loop filter.

21. A phase locked loop circuit, comprising:

a loop path within the phase locked loop circuit;

a switchable circuit element connected within the loop path to selectively open the loop path for performing a calibration of the phase locked loop circuit;

at least one known calibration signal coupled to the switchable circuit element, the known calibration signal selectively provided to the phase locked loop circuit for open loop measurements;

a frequency measurement circuit coupled to a clock signal generated by the phase locked loop circuit; and calibration adjustment circuitry coupled to the frequency measurement circuit and at least one portion of the phase locked loop circuit, the calibration adjustment circuitry providing closed loop calibration of the phase locked loop circuit based upon open loop measurements, wherein the known calibration signal is a first known calibration signal, the circuitry further comprising a second known calibration signal, the second known calibration signal coupled to a second switchable circuit element, the second known calibration signal selectively provided to the phase locked loop circuit for open loop measurements.

22. The circuitry of claim 21 wherein the first known calibration signal is provided as at phase detector input and the second known signal calibration signal is provided at a charge pump input.

23. The circuitry of claim 21 wherein the wherein the calibration adjustment circuitry adjusts the charge pump output and an element of a loop filter during closed loop conditions.

24. A phase locked loop circuit, comprising:

a loop path within the phase locked loop circuit;

a switchable circuit element connected within the loop path to selectively open the loop path for performing a calibration of the phase locked loop circuit;

at least one known calibration signal coupled to the switchable circuit element, the known calibration signal selectively provided to the phase locked loop circuit for open loop measurements;

a frequency measurement circuit coupled to a clock signal generated by the phase locked loop circuit;

calibration adjustment circuitry coupled to the frequency measurement circuit and at least one portion of the phase locked loop circuit, the calibration adjustment circuitry providing closed loop calibration of the phase locked loop circuit based upon open loop measurements; and a controllable oscillator providing an output of the phase locked loop and feedback loop divider, the controllable oscillator having a gain that is adjustable in proportion to the feedback divider modulus.

* * * * *

UNITED STATES PATENT AND TRADEMARK OFFICE
CERTIFICATE OF CORRECTION

PATENT NO. : 7,095,287 B2  
APPLICATION NO. : 11/023981  
DATED : August 22, 2006  
INVENTOR(S) : Maxim et al.

It is certified that error appears in the above-identified patent and that said Letters Patent is hereby corrected as shown below:

In claim 1, column 19, line 3, insert--:-- after "comprising".

In claim 6, column 19, line 36, delete "know," and insert --known--.

In claim 7, column 19, line 39, delete "know," and insert --known--.

In claim 11, column 19, line 50, delete "is".

In claim 13, column 19, line 59, delete the first use of "is".

In claim 17, column 20, line 38, delete "at," and insert --a--.

In claim 22, column 22, line 13, delete "at," and insert --a--.

Signed and Sealed this

Twenty-second Day of May, 2007

JON W. DUDAS  
*Director of the United States Patent and Trademark Office*